(12) United States Patent
Wells et al.

(10) Patent No.: US 9,142,767 B2
(45) Date of Patent: Sep. 22, 2015

(54) RESISTIVE MEMORY CELL INCLUDING INTEGRATED SELECT DEVICE AND STORAGE ELEMENT

(75) Inventors: David H. Wells, Boise, ID (US); D. V. Nirmal Ramaswamy, Boise, ID (US); Kirk D. Prall, Boise, ID (US)

(73) Assignee: Micron Technology, Inc., Boise, ID (US)

(*) Notice: Subject to any disclaimer, the term of this patent is extended or adjusted under 35 U.S.C. 154(b) by 129 days.

(21) Appl. No.: 13/234,875

(22) Filed: Sep. 16, 2011

(65) Prior Publication Data

US 2013/0069030 A1 Mar. 21, 2013

(51) Int. Cl.
*H01L 47/00* (2006.01)
*H01L 45/00* (2006.01)
*H01L 27/24* (2006.01)

(52) U.S. Cl.
CPC .......... *H01L 45/085* (2013.01); *H01L 27/2409* (2013.01); *H01L 27/2463* (2013.01); *H01L 45/1233* (2013.01); *H01L 45/1266* (2013.01); *H01L 45/142* (2013.01); *H01L 45/143* (2013.01); *H01L 45/146* (2013.01); *G11C 2213/73* (2013.01)

(58) Field of Classification Search
CPC .................................................. G11C 2213/73
USPC .............................................. 257/471, 2, 4, 5
See application file for complete search history.

(56) References Cited

U.S. PATENT DOCUMENTS

| | | | |
|---|---|---|---|
| 5,686,341 A * | 11/1997 | Roesner ........................ | 438/467 |
| 6,944,052 B2 | 9/2005 | Subramanian et al. | |
| 7,608,514 B2 | 10/2009 | Hsu et al. | |
| 7,764,477 B2 | 7/2010 | Tang et al. | |
| 7,884,349 B2 | 2/2011 | Rinerson et al. | |
| 7,888,240 B2 | 2/2011 | Hamamjy et al. | |
| 7,897,951 B2 | 3/2011 | Rinerson et al. | |
| 7,957,207 B2 | 6/2011 | Parkinson | |
| 2004/0016923 A1* | 1/2004 | Yu et al. ........................ | 257/49 |
| 2006/0250837 A1 | 11/2006 | Herner et al. | |
| 2007/0015348 A1* | 1/2007 | Hsu et al. ...................... | 438/570 |
| 2007/0080345 A1 | 4/2007 | Joo et al. | |
| 2008/0278990 A1* | 11/2008 | Kumar et al. ................. | 365/148 |
| 2008/0310209 A1 | 12/2008 | Liu et al. | |
| 2009/0032817 A1 | 2/2009 | Li et al. | |
| 2009/0224224 A1* | 9/2009 | Fujii et al. ..................... | 257/2 |

(Continued)

OTHER PUBLICATIONS

Lee et al., "2-stack 1D-1R Cross-point Structure with Oxide Diodes as Switch Elements for High Density Resistance RAM Applications," Electron Devices Meeting, IEDM 2007. IEEE International, pp. 771,774, (Dec. 10-12, 2007); doi: 10.1109/IEDM.2007.4419061.*

(Continued)

*Primary Examiner* — Peniel M Gumedzoe
*Assistant Examiner* — Christopher Johnson
(74) *Attorney, Agent, or Firm* — Brooks, Cameron & Huebsch, PLLC

(57) ABSTRACT

Resistive memory cells including an integrated select device and storage element and methods of forming the same are described herein. As an example, a resistive memory cell can include a select device structure including a Schottky interface, and a storage element integrated with the select device structure such that an electrode corresponding to the Schottky interface serves as a first electrode of the storage element. The storage element can include a storage material formed between the first electrode and a second electrode.

10 Claims, 3 Drawing Sheets

(56) References Cited

U.S. PATENT DOCUMENTS

| | | |
|---|---|---|
| 2010/0102298 A1 | 4/2010 | Wu |
| 2010/0123542 A1 | 5/2010 | Vaithyanathan et al. |
| 2010/0157666 A1 | 6/2010 | Parkinson |
| 2010/0162067 A1 | 6/2010 | Norman |
| 2010/0265762 A1 | 10/2010 | Cheung et al. |
| 2010/0315866 A1 | 12/2010 | Park et al. |
| 2011/0006276 A1* | 1/2011 | Kim et al. .................. 257/2 |
| 2011/0007544 A1 | 1/2011 | Vaithyanathan et al. |
| 2011/0007551 A1 | 1/2011 | Tian et al. |
| 2011/0051494 A1 | 3/2011 | Kohlstedt |
| 2011/0062408 A1* | 3/2011 | Kozicki .................. 257/4 |
| 2011/0069529 A1 | 3/2011 | Srinivasan et al. |
| 2011/0133149 A1 | 6/2011 | Sonehara |
| 2011/0134685 A1 | 6/2011 | Kau et al. |
| 2011/0186801 A1 | 8/2011 | Yang et al. |
| 2011/0194338 A1* | 8/2011 | Baek et al. .................. 365/158 |
| 2011/0220876 A1 | 9/2011 | Nishizawa et al. |
| 2011/0260131 A1 | 10/2011 | Sonehara |
| 2012/0080665 A1* | 4/2012 | Blom et al. .................. 257/40 |
| 2013/0001494 A1 | 1/2013 | Chen |
| 2013/0069028 A1 | 3/2013 | Wells et al. |
| 2013/0070511 A1 | 3/2013 | Wells et al. |

OTHER PUBLICATIONS

Sung, "Nanoscale Memristive Devices for Memory and Logic Applications," PhD Dissertation at Univ. of Michigan, 2010; found online at http://deepblue.lib.umich.edu/handle/2027.42/75835.*

Restriction Requirement from U.S. Appl. No. 13/234,771, dated Jun. 18, 2013, 5 pp.

Non-Final Office Action from U.S. Appl. No. 13/234,771, dated Nov. 6, 2013, 16 pp.

Chshiev, et al. "Magnetic diode effect in double-barrier tunnel junctions", Europhys. Lett., 58 (2), Apr. 15, 2002, pp. 257-263.

Non-Final Office Action from U.S. Appl. No. 13/234,659, dated Sep. 8, 2014, 23 pp.

Final Office Action from U.S. Appl. No. 13/234,659, dated Mar. 27, 2015, 24 pp.

Madelung, Semiconductors—Basic Data (2nd revised Edition). Springer-Verlag Berlin Heidelberg 1991, p. 239.

Non-Final Office Action from U.S. Appl. No. 131/234,659, dated Jul. 15, 2015, 23 pp.

* cited by examiner

RESISTIVE MEMORY CELL INCLUDING INTEGRATED SELECT DEVICE AND STORAGE ELEMENT

TECHNICAL FIELD

The present disclosure relates generally to semiconductor memory devices and methods, and more particularly, to resistive memory cells including an integrated select device and storage element.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Resistive memory devices include resistive memory cells that store data based on the resistance level of a storage element. The cells can be programmed to a desired state, e.g., corresponding to a particular resistance level, such as by applying sources of energy, such as positive or negative voltages to the cells for a particular duration. Some resistive memory cells can be programmed to multiple states such that they can represent, e.g., store, two or more bits of data.

The programmed state of a resistive memory cell may be determined, e.g., read, for example, by sensing current through the selected resistive memory cell responsive to an applied interrogation voltage. The sensed current, which varies based on the resistance level of the memory cell, can indicate the programmed state of the resistive memory cell.

In various instances, arrays of resistive memory cells can include a 1D1R (one diode/one resistor) configuration in a cross point array architecture. However, such 1D1R cross point architectures can be prone to read disturbance problems. For instance, as part of a read operation, current can flow from a selected access line, e.g., word line, through a selected memory cell, to a data/sense line, e.g., bit line. However, in various array architectures such as cross-point architectures, current also flows into unselected word lines that cross over the selected bit line. Conduction of current into unselected word lines can reduce the ability to distinguish between data states, e.g., by decreasing output impedance, among other drawbacks.

DETAILED DESCRIPTION

Figure 1:
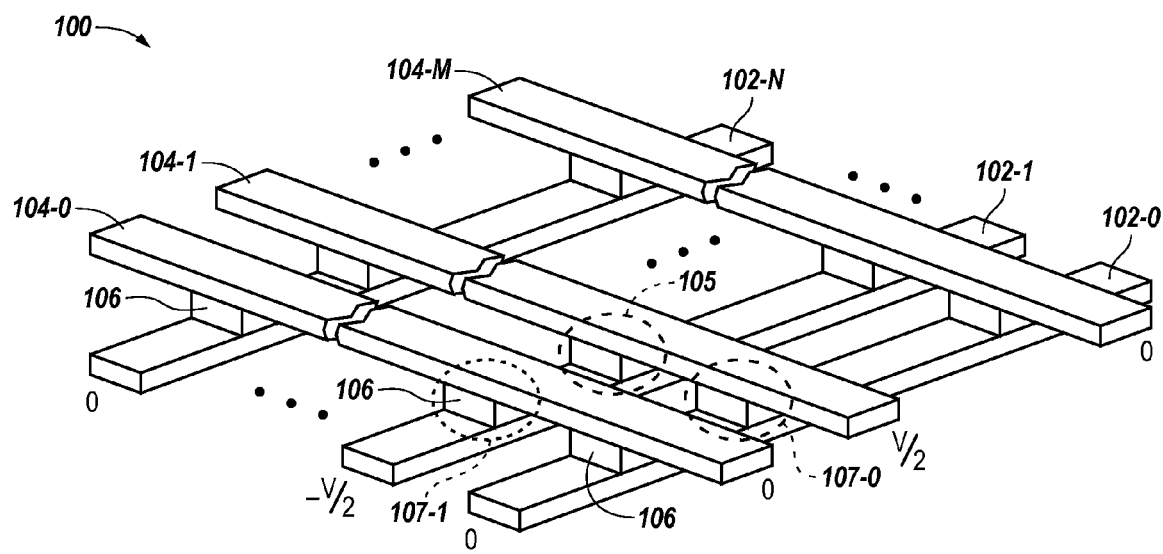
FIG. 1 is a diagram of a portion of an array of resistive memory cells in accordance with one or more embodiments of the present disclosure.

Resistive memory cells including an integrated select device and storage element and methods of forming the same are described herein. As an example, a resistive memory cell can include a select device structure including a Schottky interface, and a storage element integrated with the select device structure such that an electrode corresponding to the Schottky interface serves as a first electrode of the storage element. The storage element can include a storage material formed between the first electrode and a second electrode.

Embodiments of the present disclosure can provide various benefits as compared to previous resistive memory cells, e.g., 1D1R resistive memory cells. For instance, providing a resistive memory cell including an integrated select device and storage element can reduce the physical size, e.g., footprint, as compared to previous memory cells while maintaining an on/off current ratio (Ion/Toff) suitable for a partial select read method, e.g., a half select read method or third select read method. As an example, an integrated select device can behave as a current limiter to permit high voltage bipolar programming without flowing current into unselected word lines during lower voltage read operations. One or more embodiments of the present disclosure can support current densities on the order of $10^6$ or $10^7$ A/cm$^2$, which can be higher than prior art resistive memory cells coupled to select devices such as metal-insulator-metal (MIM) select devices or metal-insulator-insulator-metal (MIIM) select devices, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a diagram of a portion of an array 100 of memory cells 106 in accordance with one or more embodiments of the present disclosure. The array 100 is a two terminal crosspoint array having memory cells 106 located at the intersections of a number of conductive access lines 102-0, 102-1, . . . , 102-N, which may be referred to herein as word lines, and a number of conductive data/sense lines 104-0, 104-1, . . . , 104-M, which may be referred to herein as bit lines. As illustrated, the word lines 102-0, 102-1, . . . , 102-N are parallel to each other and are orthogonal to the bit lines 104-0, 104-1, ..., 104-M, which are substantially parallel to each other; however, embodiments are not so limited.

Each memory cell 106 may include a storage element, e.g. a resistive memory element coupled in series with a select device, e.g., an access device, in accordance with one or more embodiments described herein. In various embodiments, and as described further herein in connection with FIGS. 2-4, the memory cells 106 can include a select device having a corresponding Schottky interface integrated with a storage element.

The storage element can include a programmable portion, e.g., a storage material, which may have a variable resistance, formed between a pair of electrodes, for example. The storage element can include, for example, a storage material such as a transition metal oxide material or a perovskite including two or more metals, e.g., transition metals, alkaline earth metals, and/or rare earth metals. Other examples of resistance variable storage materials associated with the storage element of a memory cell 106 can include chalcogenides, binary metal oxides, colossal magnetoresistive materials, and/or various polymer-based resistive variable materials, among others. As such, the memory cells 106 can be RRAM cells, PCRAM cells, and/or conductive bridging memory cells, among various other types of resistive memory cells.

As an example, the array 100 can be operated in accordance with a half select method, e.g., a half select biasing scheme. A half select method can include applying a half select voltage (V/2) to a selected bit line, e.g., a bit line coupled to a selected memory cell, and a negative half select voltage (−V/2) to a selected word line, e.g., a word line coupled to the selected memory cell, while biasing unselected word lines at a reference potential, e.g., a ground potential. In the example illustrated in FIG. 1, memory cell 105 is a selected memory cell. That is, selected memory cell 105 is coupled to a selected bit line 104-1 biased at V/2 and a selected word line 102-1 biased at −V/2. As such, the full select voltage (V) is applied across the selected memory cell 105. The unselected memory cells coupled to the selected bit line 104-1 and selected word line 102-1, e.g., unselected memory cells 107-0 and 107-1, experience a half select voltage of +/−V/2 and can be referred to as "half selected" cells. The unselected memory cells coupled to unselected bit lines and/or word lines are unbiased, e.g., they experience a ground potential of 0V, in this example. The select voltage (V) can be an operating voltage such as a write voltage or a read voltage, for instance.

It can be beneficial for resistive memory cells to have an associated half select ratio (HSR) that is as large as possible. The HSR can refer to the ratio of the current flowing through a selected memory cell, e.g., 105-1, to the current flowing through a half selected memory cell, e.g., 107-0 and 107-1. One or more embodiments can provide a half select ratio of $10^4$:1 or $10^5$:1 or larger, for example. The larger the HSR, the lower the power dissipation caused by current flow in half-selected memory cells, e.g., 107-0 and 107-1, and the greater the signal to noise ratio (S/N) during read and/or write operations, which can reduce the likelihood of read and/or write disturb to half selected memory cells.

Embodiments of the present disclosure are not limited to a half select method associated with programming or reading a memory cell. For instance, the array 100 can be operated in accordance with other biasing schemes, such as a one third select method. As an example, a one third select method can include applying a full select voltage (V) to a selected bit line and a ground potential to a selected word line, while biasing unselected bit lines at V/3 and unselected word lines at (2V)/3, such that the voltage between unselected word lines and bit lines is about +/−V/3.

Figure 2:
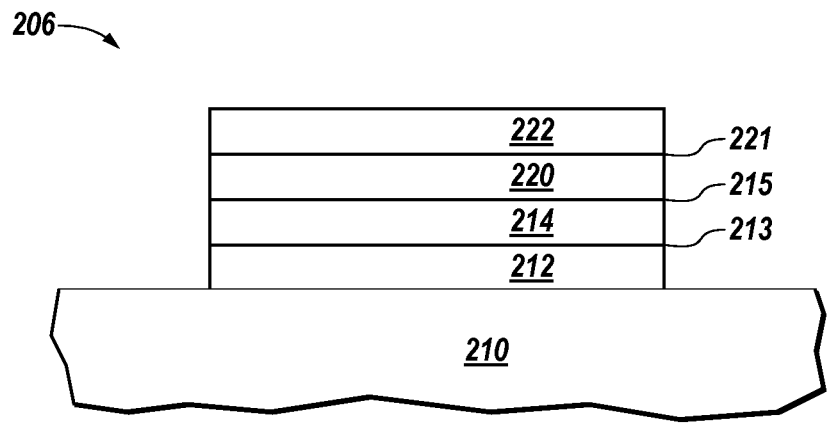
FIG. 2 illustrates a cross-sectional view of a resistive memory cell in accordance with one or more embodiments of the present disclosure.

FIG. 2 illustrates a cross-sectional view of a resistive memory cell 206 in accordance with one or more embodiments of the present disclosure. The memory cell 206 can be a memory cell such as memory cell 106 of array 100 shown in FIG. 1. The memory cell 206 comprises an electrode 212 formed on a substrate 210. The substrate 210 can be a silicon substrate, silicon on insulator (SOI) substrate, or silicon on sapphire (SOS) substrate, among various other substrate materials.

The electrode 212 can include a metal material, for instance. In various embodiments, the electrode 212 can include a reactive metal material such as titanium, hafnium, zirconium, gadolinium, and/or dysprosium, among other metals and combinations thereof. The electrode 212 can also include a metal material such as copper telluride and/or other copper and/or tellurium containing metal materials, e.g., CuTeGe, CuTeGeSiB, CuTePt, and CuTeC and/or combinations thereof, for instance.

The memory cell 206 includes a storage material 214 formed on the electrode 212, a semiconductor material 220 formed on the storage material 214, and an electrode 222 formed on the semiconductor material 220. The storage material 214 can be, for instance, one or more resistance variable materials such as a transition metal oxide material (e.g., hafnium oxide, zirconium oxide, titanium oxide, etc.) or a perovskite including two or more metals, e.g., transition metals, alkaline earth metals, and/or rare earth metals. Other examples of storage material 214 can include chalcogenides (e.g., GeS, GeSe, etc.), binary metal oxides, colossal magnetoresistive materials, solid electrolyte materials (e.g., AgS), and/or various polymer-based resistive variable materials, among others. The particular storage material 214 corresponding to memory cell 206 can depend on factors such as the particular type of memory cell 206, e.g., whether the cell 206 is an PCRAM cell, an RRAM cell, or a CBRAM cell, for instance.

The semiconductor material 220 can include materials such as silicon (Si), germanium (Ge), silicon germanium (SiGe), and/or silicon carbide (SiC), for instance, and/or various combinations thereof. As an example, the semiconductor material 220 can include a multilayer structure such as a Si/SiGe/Si structure.

The electrode 222 can include a metal material, for instance. In various embodiments, the electrode 222 can include a metal material that is non-reactive relative to the electrode 212. That is, the electrode 222 can be an inert electrode of cell 206. In embodiments in which electrode 222 is an inert electrode, the electrode 222 can include metal materials such as titanium nitride, tantalum nitride, platinum, tungsten nitride, and/or ruthenium, for instance. The memory cell 206 is a two terminal memory cell with the electrodes 212 and 222 serving as the two terminals.

In various embodiments, the electrode 222 is formed in contact with the semiconductor material 220 such that a Schottky interface 221 is formed between the electrode 222 and the semiconductor material 220. The Schottky interface 221 between electrode 222 and semiconductor material 220 can serve as a select device portion, e.g., a diode, of the memory cell 206. The select device portion is integrated with a resistive storage portion of the memory cell 206. For instance, in the example illustrated in FIG. 2, a combination of the semiconductor material 220 and storage material 214 form the resistive storage portion of the cell 206. As an example, in operation, the interface 215 between the semiconductor material 220, e.g., silicon, and storage material 214, e.g., metal oxide, can act as a metal. For instance, responsive to an applied voltage across the cell 206, the semiconductor material 220 can provide electrons used to alter the resistance of the storage material 214. As such, the semiconductor material 220 is integrated with the select device portion of the cell 206 as well as the resistive storage portion of the cell 206. That is the memory cell 206 includes a select device structure integrated with, and electrically in series with, the resistive storage portion of the cell.

In various embodiments, the interface 213 between the electrode 212 and the storage material 214 and/or the interface 215 between the storage material 214 and the semiconductor material 220 can also be Schottky interfaces. As an example, the storage material 214 can include a semiconductor material such that a semiconductor-metal interface 213 is formed with a metal material of electrode 212.

Embodiments are not limited to the example illustrated in FIG. 2. For instance, the ordering of the materials can be reversed such that the electrode 222 is formed on substrate 210, the semiconductor material 220 is formed on electrode 222, the storage material 214 is formed on the semiconductor material 220, and the electrode 212 is formed on the storage material 214.

As an example, the electrodes 212 and 222 may be formed to a thickness of between about 30 Angstroms and about 500 Angstroms, the semiconductor material 220 may be formed to a thickness of about 30 Angstroms to about 700 Angstroms, and the storage material 214 may be formed to a thickness of between about 30 Angstroms and about 1000 Angstroms. In one or more embodiments, the thickness of the cell 206 is not greater than about 500 Angstroms. In one or more embodiments, the cell 206 is formed such that each of the electrodes 212 and 222, the storage material 214, and the semiconductor material 220 have a thickness of not greater than about 50 Angstroms.

Figure 3:
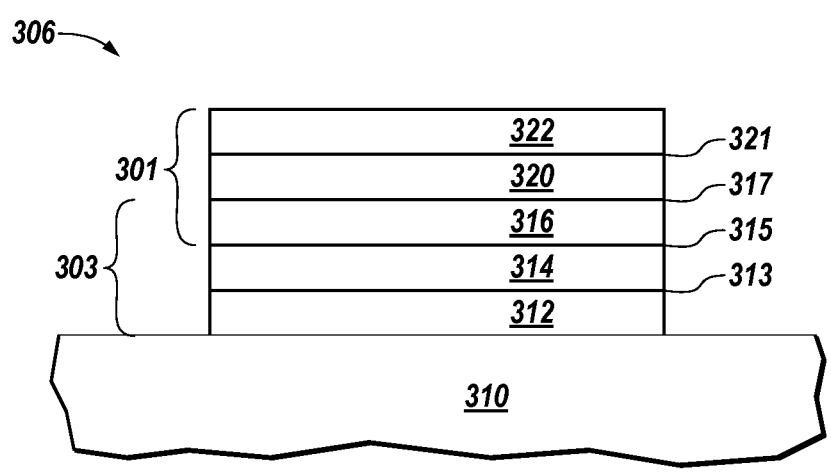
FIG. 3 illustrates a cross-sectional view of a resistive memory cell in accordance with one or more embodiments of the present disclosure.

FIG. 3 illustrates a cross-sectional view of a resistive memory cell 306 in accordance with one or more embodiments of the present disclosure. The memory cell 306 can be a memory cell such as memory cell 106 of array 100 shown in FIG. 1. The memory cell 306 is formed on a substrate 310 and comprises a select device structure 301 including a Schottky interface and a storage element 303 integrated with the select device structure 301.

The storage element 303 includes a storage material 314 formed between a pair of electrodes 312 and 316. The storage element 303 can be, for instance, an RRAM storage element 303 including a metal oxide material 314 formed between a reactive metal material 312 and a non-reactive metal material 316.

The select device structure 301 can be a diode having a metal-semiconductor-metal (MSM) structure. As such, the select device 301 can include a semiconductor material 320 formed between the electrode 316 and an electrode 322. The electrode 322 can be a metal material such that interfaces 321 and 317 can be Schottky interfaces. The MSM diode 301 can be a non-ohmic device capable of supporting current densities above $10^5$ A/cm$^2$, for instance. In various embodiments, the interfaces 315 and/or 313 can also be Schottky interfaces.

In the example illustrated in FIG. 3, the electrode 316 is shared by the select device 301 and the storage element 303. That is, the electrode 316 corresponding to Schottky interface 315 serves as an electrode of the select device 301 and as an electrode of the storage element 303. As such, the storage element 303 is integrated with the select device 301.

As an example, the shared electrode 316 can function in multiple capacities. For instance, the electrode 316 can include a non-reactive metal material, e.g., platinum, such that the electrode 316 serves as an ion-plating site associated with Schottky interface 315 of the MSM diode 301. The shared electrode 316 can also serve as a non-reactive electrode for the storage element 303, for instance. Providing a cell, such as cell 306, having an integrated storage element 303 and select device 301 can reduce processing complexity associated with forming a memory cell, among other benefits. For example, providing an integrated select device and storage element can improve memory density by reducing the physical footprint of a memory cell by reducing the number of materials, e.g., material layers, used to form a memory cell stack.

In the example illustrated in FIG. 3, the memory cell 306 is a two terminal cell with the electrodes 312 and 322 serving as the two cell terminals. As such, the cell 306 is operated via applied voltages to the electrodes 312 and 322, e.g., via a respective bit line and word line.

Embodiments are not limited to the example illustrated in FIG. 3. For instance, the ordering of the components of memory cell 306 can be reversed such that the select device structure 301 is formed on the substrate 310 and the storage element 301 is formed on the select device structure 301, e.g., with electrode 316 being maintained as a shared electrode. As an example, the materials 312, 316, and 322 may be formed to a thickness of between about 30 Angstroms and about 500 Angstroms, the semiconductor material 320 may be formed to a thickness of about 30 Angstroms to about 700 Angstroms, and the storage material 314 may be formed to a thickness of between about 30 Angstroms and about 1000 Angstroms. In one or more embodiments, the thickness of the cell 306 is not greater than about 500 Angstroms. In one or more embodiments, the cell 306 is formed such that each of the materials 312, 316, and 322, the storage material 314, and the semiconductor material 320 have a thickness of not greater than about 50 Angstroms. However, embodiments are not so limited.

Figure 4:
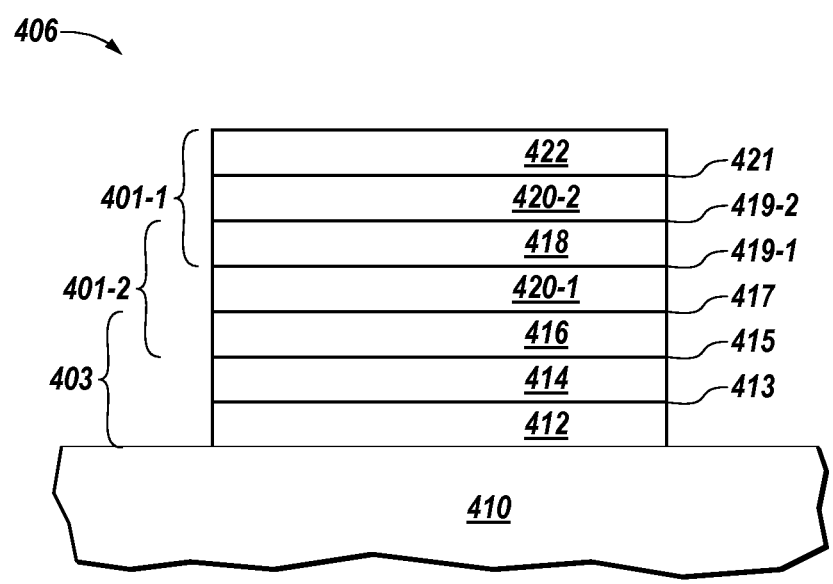
FIG. 4 illustrates a cross-sectional view of a resistive memory cell in accordance with one or more embodiments of the present disclosure.

FIG. 4 illustrates a cross-sectional view of a resistive memory cell 406 in accordance with one or more embodiments of the present disclosure. The memory cell 406 can be a memory cell such as memory cell 106 of array 100 shown in FIG. 1. The memory cell 406 is formed on a substrate 410 and comprises a select device structure including a Schottky interface and a storage element integrated with the select device structure. In this example, the select device structure includes a pair of back to back MSM diodes 401-1 and 401-2. As such, diode 401-1 includes a semiconductor material 420-2 formed between two metal materials 418 and 422, and diode 401-2 includes a semiconductor material 420-1 formed between two metal materials 418 and 416. The interfaces 417, 419-1, 419-2, and 421 associated with select devices 401-1 and 401-2 can be Schottky interfaces.

The semiconductor materials 420-1 and 420-2 can include materials such as silicon (Si), germanium (Ge), silicon germanium (SiGe), and/or silicon carbide (SiC), for instance, and/or various combinations thereof. As an example, the semiconductor materials 420-1 and/or 420-2 can include a multilayer structure such as a Si/SiGe/Si structure, for instance.

The storage element 403 includes a storage material 414 formed between a pair of electrodes 412 and 416. The storage element 403 can be, for instance, an RRAM storage element 403 including a metal oxide material 414 formed between a reactive metal material 412 and a non-reactive metal material 416. However, embodiments are not so limited. For instance, the particular storage material 414 can depend on factors such as the particular type of memory cell 406, e.g., whether the cell 406 is an PCRAM cell, an RRAM cell, or a CBRAM cell, for instance.

The electrode 412 can include a metal material such as a copper telluride material, e.g., CuTeGe, CuTeGeSiB, CuTePt, and CuTeC and/or combinations thereof, for instance. In various embodiments, the interfaces 413 and/or 415 can be Schottky interfaces. The electrode 412 can include a reactive metal material such as titanium, hafnium, zirconium, gadolinium, and/or dysprosium, among other metals and combinations thereof.

In the example illustrated in FIG. 4, the material 416 includes a metal material 416 that is shared by the select device 401-2 and the storage element 403. That is, the metal material 416 corresponds to a Schottky interface 415 and also serves as an electrode of the storage element 403. As such, the storage element 403 is integrated with the select device 401-2.

Similar to the shared electrode 316 of cell 306 shown in FIG. 3, the shared electrode 416 can function in multiple capacities. For instance, the electrode 416 can include a non-reactive metal material, e.g., platinum, such that the electrode 416 serves as an ion-plating site associated with Schottky interface 415 of the MSM diode 401-2. The shared electrode 416 can also serve as a non-reactive electrode for the storage element 403, for instance.

In the example illustrated in FIG. 4, the memory cell 406 is a two terminal cell with the electrodes 412 and 422 serving as the two cell terminals. As such, the cell 406 is operated via applied voltages to the electrodes 412 and 422, e.g., via a respective bit line and word line. In embodiments in which electrode 422 is an inert electrode, the electrode 422 can include metal materials such as titanium nitride, tantalum nitride, platinum, tungsten nitride, and/or ruthenium, for instance.

In one or more embodiments, the memory cell 406 can be formed at a temperature at or below about 450° C., which can enable the ability to stack memory cells in a three-dimensional array structure, among other benefits. For instance, one or more memory cells in accordance with embodiments of the present disclosure can have an associated on/off current ratio (Ion/Ioff) suitable for a partial select read method, e.g., a half select read method or third select read method.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A resistive memory cell, comprising:
   a select device structure including a Schottky interface; and
   a storage element integrated with the select device structure such that an electrode corresponding to the Schottky interface serves as a first electrode of the storage element;
   wherein the storage element includes a storage material formed between the first electrode and a second electrode;
   wherein a semiconductor material is formed in physical contact with the first electrode and the storage material;
   wherein the second electrode is formed in physical contact with the storage material; and
   wherein the semiconductor material includes at least two material layers with each of the at least two material layers comprising different semiconductor materials; and
   wherein the first electrode is formed of a non-reactive metal material and the second electrode is formed of a reactive metal material.

2. The resistive memory cell of claim 1, wherein the storage material includes a metal oxide material.

3. The resistive memory cell of claim 1, wherein the second electrode comprises at least copper and tellurium.

4. A resistive memory cell, comprising:
   a semiconductor material formed in physical contact with a storage material;
   a first electrode formed in physical contact with the semiconductor material such that a Schottky interface is formed between the first electrode and the semiconductor material; and
   a second electrode formed in contact with the storage material such that a Schottky interface formed between the second electrode and the storage material;
   wherein the resistive memory cell includes a select device portion integrated with a resistive storage portion;
   wherein the select device portion includes the first electrode and the semiconductor material; and
   wherein the resistive storage portion includes the storage material and the semiconductor material; and
   wherein the second electrode is formed of a reactive metal material and the first electrode is formed of a metal material that is non-reactive relative to the second electrode.

5. The resistive memory cell of claim 4, wherein the memory cell is a two terminal device with the first and second electrodes serving as the respective two terminals.

6. An array of resistive memory cells, comprising:
   a number of first conductive lines;
   a number of second conductive lines; and
   a number of resistive memory cells located at intersections of the number of first conductive lines and the number of second conductive lines, the number of resistive memory cells including:
      a select device structure including:
         a first Schottky interface;
         a second Schottky interface;
         a third Schottky interface; and
         a fourth Schottky interface; and
      a storage element integrated with the select device structure such that an electrode corresponding to the first Schottky interface serves as a first electrode of the storage element;

wherein the storage element includes a storage material formed between the first electrode and a second electrode;

wherein the second Schottky interface exists between a third electrode and a first semiconductor material; and wherein the third Schottky interface exists between a fourth electrode and a second semiconductor material.

7. The array of claim 6, wherein the number of first conductive lines are bit lines and the number of second conductive lines are word lines.

8. The array of claim 6, wherein the array is formed at a temperature not greater than about 450° C.

9. A method of forming a resistive memory cell, the method comprising:

forming a storage element including a storage material formed between a first electrode and a second electrode; and forming a select device structure integrated with the storage element, the select device structure including a metal material in physical contact with a semiconductor material and providing a Schottky interface;

wherein the metal material serves as the second electrode such that the second electrode is shared by the storage element and the select device structure;

wherein the storage material is formed in physical contact with the semiconductor material; wherein the resistive memory cell is a two terminal cell with the first electrode and the second electrode serving as a respective first and second terminal, and wherein the method includes forming the storage material in contact with the first electrode; and wherein the metal material serving as the second electrode is a reactive metal material including at least one of: titanium, zirconium, hafnium, gadolinium, and dysprosium.

10. A resistive memory cell, comprising:

a select device structure including a Schottky interface; and a storage element integrated with the select device structure such that an electrode corresponding to the Schottky interface serves as a first electrode of the storage element;

wherein the storage element includes a storage material formed between the first electrode and a second electrode;

wherein a semiconductor material is formed in physical contact with the first electrode and the storage material;

wherein the second electrode is formed in physical contact with the storage material; and wherein the semiconductor material includes at least two material layers with each of the at least two material layers comprising different semiconductor materials; and wherein the second electrode comprises at least copper and tellurium.

* * * * *